US012765396B2

(12) United States Patent
Wang et al.

(10) Patent No.: US 12,765,396 B2
(45) Date of Patent: Oct. 13, 2026

(54) SEMICONDUCTOR LEADFRAME PACKAGES AND RELATED METHODS

(71) Applicant: SEMICONDUCTOR COMPONENTS INDUSTRIES, LLC, Scottsdale, AZ (US)

(72) Inventors: Lijuan Wang, Suzhou (CN); Ian Ceazar Bucayon Barias, Butuan City (PH); Sen Sun, Suzhou (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 183 days.

(21) Appl. No.: 18/664,567

(22) Filed: May 15, 2024

(65) Prior Publication Data

US 2025/0259915 A1 Aug. 14, 2025

Related U.S. Application Data

(60) Provisional application No. 63/552,611, filed on Feb. 12, 2024.

(51) Int. Cl.
*H10W 70/40* (2026.01)
*H10W 70/04* (2026.01)

(52) U.S. Cl.
CPC ........ *H10W 70/411* (2026.01); *H10W 70/048* (2026.01)

(58) Field of Classification Search
CPC .......................... H10W 70/411; H10W 70/048
See application file for complete search history.

(56) References Cited

U.S. PATENT DOCUMENTS 7,002,239 B1 2/2006 Nadarajah et al.
8,236,612 B2 8/2012 San Antonio et al.
8,450,149 B2 5/2013 Bayan et al.
2017/0221803 A1 8/2017 Kamachi

FOREIGN PATENT DOCUMENTS

JP 2013026361 A 2/2013
JP 2013254801 A * 12/2013

OTHER PUBLICATIONS

German Search Report, 102024126993.6, German Patent Office, May 26, 2025.

* cited by examiner

*Primary Examiner* — Pete T Lee
(74) *Attorney, Agent, or Firm* — IPTechLaw

(57) ABSTRACT

In implementations of a leadframe for a semiconductor package, the leadframe may include a die attach pad including a swag area; and one or more leads. The swag area may include an alternating pattern therein including at least two raised features, where each of the at least two raised features may be configured to support a clamping finger during a wirebonding process.

18 Claims, 7 Drawing Sheets

SEMICONDUCTOR LEADFRAME PACKAGES AND RELATED METHODS

CROSS REFERENCE TO RELATED APPLICATIONS

This document claims the benefit of the filing date of U.S. Provisional Patent Application 63/552,611, entitled "Semiconductor Power Package" to Wang et al. which was filed on Feb. 12, 2024, the disclosure of which is hereby incorporated entirely herein by reference.

BACKGROUND

1. Technical Field

Aspects of this document relate generally to semiconductor packages, such as for semiconductor die. More specific implementations involve semiconductor packages with leadframes.

2. Background

Various semiconductor packages have been devised that work to provide mechanical support or protection from shock and vibration. Other semiconductor packages work to provide protection from humidity and other environmental factors. Thermal management for semiconductor die and components in the semiconductor package also governs various semiconductor package designs.

SUMMARY

In implementations of a leadframe for a semiconductor package, the leadframe may include a die attach pad including a swag area; and one or more leads. The swag area may include an alternating pattern therein including at least two raised features, where each of the at least two raised features may be configured to support a clamping finger during a wirebonding process.

Implementations of a leadframe for a semiconductor package may include one, all, or any of the following:

The swag area extends along two opposing sides of the die attach pad.

The alternating pattern may be located in a first largest planar surface of the swag area and located in a second largest planar surface of the swag area opposing the first largest planar surface.

The alternating pattern may include at least two downset features in combination with the at least two raised features.

The at least two downset features may include corners, the corners including a substantially 90 degree angle.

The at least two downset features may include corners, the corners including a rounded shape.

The at least two downset features may include corners, the corners including a chamfered edge, a fileted edge, or a rounded edge.

The at least two downset features may include a mold lock pattern formed therein.

The mold lock pattern may be a dimpled pattern.

In implementations of a leadframe for a semiconductor package, the leadframe may include a die attach pad including a swag area; and one or more leads. The swag area may include an alternating pattern of indentations therein.

Implementations of a leadframe for a semiconductor package may include, one, all, or any of the following:

Two or more raised features of the alternating pattern of indentations may be configured to engage with a clamping finger during a wirebonding process.

The swag area may extend along two opposing sides of the die attach pad. The alternating pattern of indentations may be located in a first largest planar surface of the swag area and located in a second largest planar surface of the swag area opposing the first largest planar surface.

The indentations of the alternating pattern of indentations may include at least two downset features.

The at least two downset features may include corners, the corners including a substantially 90 degree angle.

The at least two downset features may include corners, the corners including a rounded shape.

The at least two downset features may include corners, the corners including a chamfered edge, a fileted edge, or a rounded edge.

The at least two downset features may include a mold lock pattern formed therein.

Implementations of a method of forming a leadframe for a semiconductor package may include providing a die attach pad; one of stamping, milling, or punching an alternating pattern into a first largest planar surface of a swag area of the die attach pad; and one of stamping, milling, or punching a corresponding alternating pattern into a second largest planar surface of the swag area of the die attach pad.

Implementations of a method of forming a leadframe for a semiconductor package may include one, all, or any of the following:

The method may include one of stamping, milling, or punching a mold lock pattern into two or more downset features of the alternating pattern.

The mold lock pattern may be a dimpled pattern.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor leadframes (leadframes) will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such leadframes, and implementing components and methods, consistent with the intended operation and methods.

Figure 2:
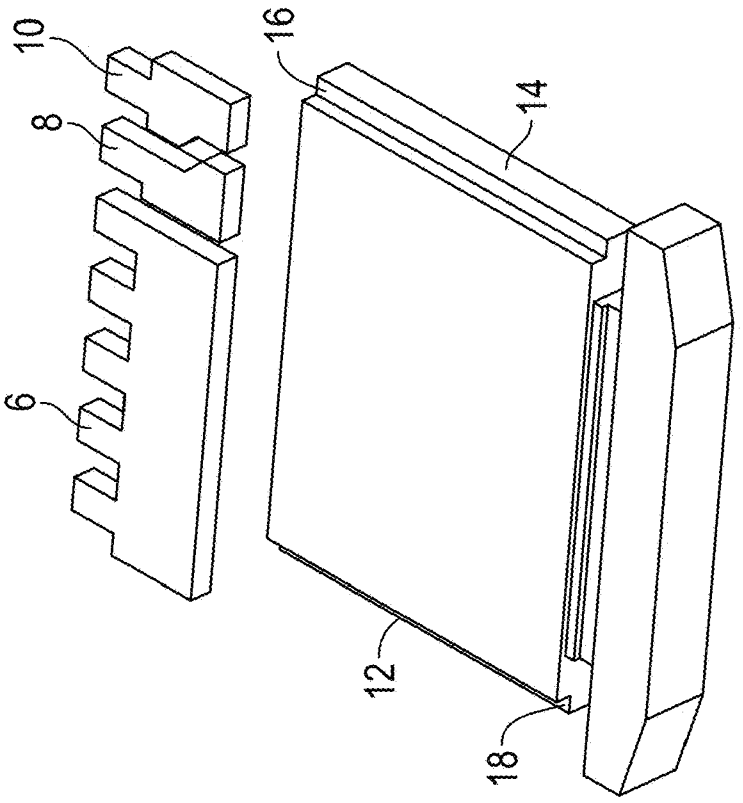
FIG. 2 is a perspective view of an implementation of a leadframe.
Figure 1:
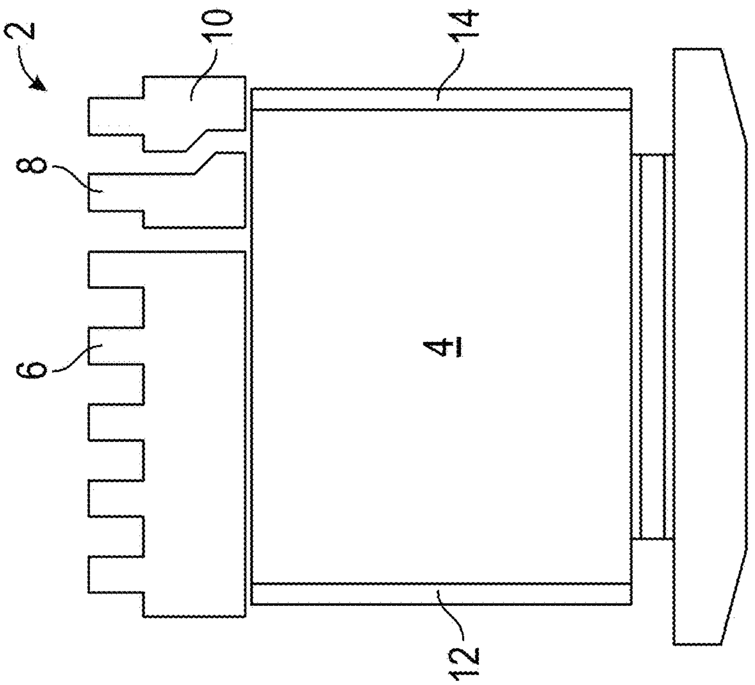
FIG. 1 is a top view of an implementation of a leadframe.

Referring to FIG. 1, an implementation of a leadframe 2 is illustrated that is designed for use in semiconductor packages that house semiconductor die. The leadframe 2 includes a die attach pad 4 and various leads 6, 8, 10 that are designed to allow for electrical connections to a semiconductor die attached to the die attach pad 4 via wire bonds formed during packaging. The die attach pad 4 includes swag areas 12, 14 on each side of a largest planar area of the die attach pad. Referring to FIG. 2, the swag areas 12, 14 include a recess/groove/flange 16, 18 in largest planar surfaces of the swag areas. These recesses 16, 18 are designed to act as mold locks for a mold compound applied over the leadframe after a semiconductor die is attached to the die attach pad and wire bonds are formed between the leads 6, 8, 10 and pads on the semiconductor die. The mold compound works to prevent ingress of contaminants and assists with providing mechanical support to the wire bonds, semiconductor die, and the leads during use of the semiconductor package.

Figure 4:
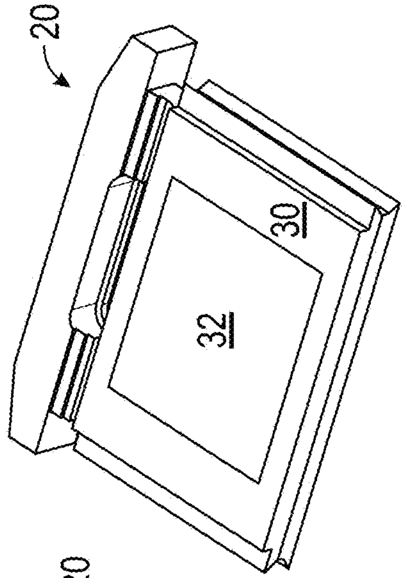
FIG. 4 is a perspective view of the implementation of the leadframe of FIG. 3 following application of a die attach material thereon.
Figure 3:
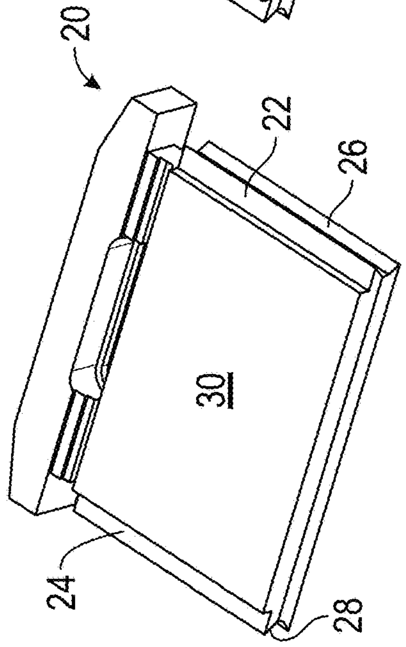
FIG. 3 is a perspective view of an implementation of a leadframe.

Referring to FIG. 3, an implementation of a leadframe 20 is illustrated in a perspective view. Here the swag areas 22, 24 also include a groove 26, 28 along a shortest edge of the swag areas 22, 24 which further assists with mold locking. The die attach pad 30 is illustrated at the beginning of a die attach process in FIG. 3. Referring to FIG. 4, the leadframe 20 is illustrated following the application of a die attach material 32, which in this case, is a sintering material designed to form a bond between the die attach pad 30 and a semiconductor die during subsequent sintering operation.

Figure 5:
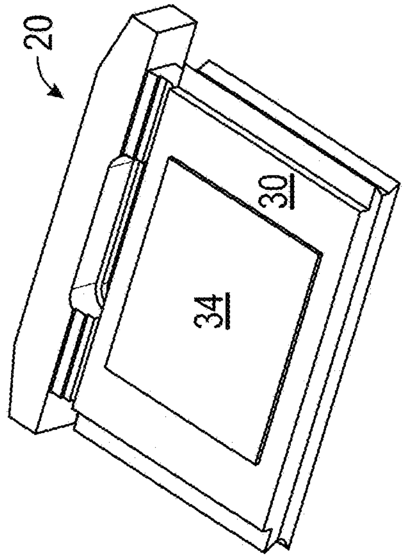
FIG. 5 is a perspective view of the implementation of the leadframe of FIG. 4 following attaching of a semiconductor die thereon.

Referring to FIG. 5, the leadframe 20 is illustrated after coupling of semiconductor die 34 to the die attach material 32 and following a sintering operation that formed a bond between the semiconductor die 34 and the die attach pad 30. At this point, the leadframe 20 and semiconductor die 34 are now ready for a wirebonding process that involves forming wirebonds between the other leads/pads of the leadframe 20 and pads/areas of the semiconductor die. While sintering is illustrated in FIGS. 3-5, other die attach processes and materials could be used, including, by non-limiting example, soldering, die attach films, polyimide films, active metal brazing, or other systems and methods for forming a bond between the material of the die and the material of the leadframe.

Figure 6:
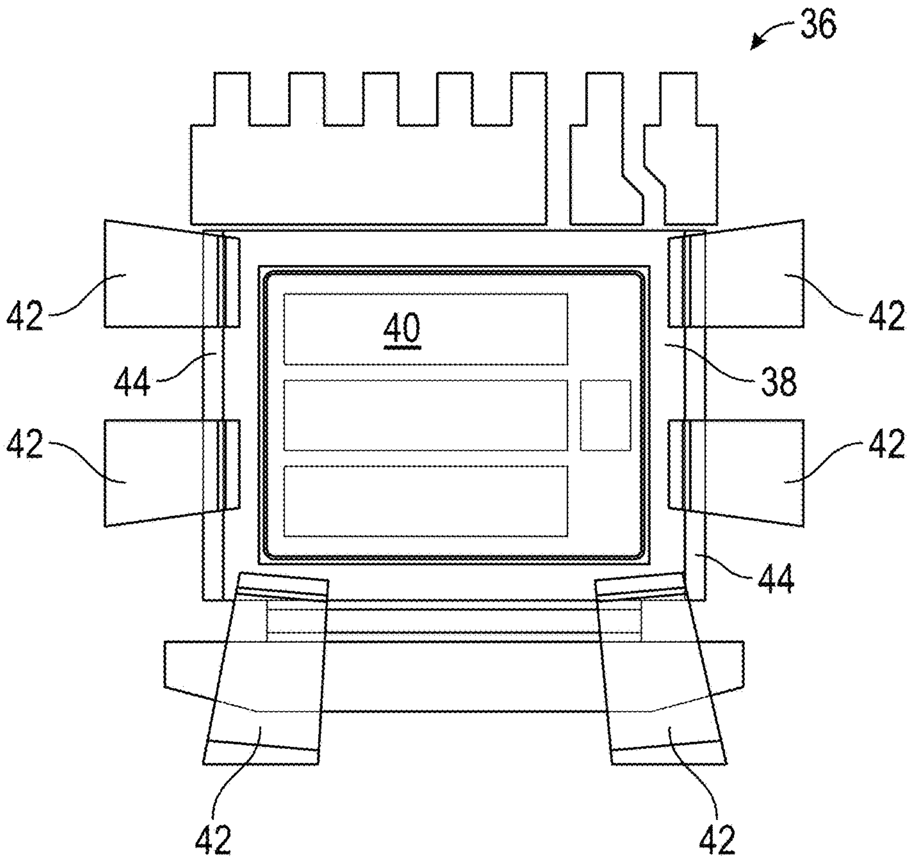
FIG. 6 is a diagram of an implementation of a leadframe with a semiconductor die thereon during a clamping operation.

Referring to FIG. 6, a top view diagram of a leadframe 36 with a die attach pad 38 is illustrated with a semiconductor die 40 attached thereto prepared for the start of a wirebonding operation. As illustrated, the leadframe 36 is coupled over an anvil (not shown) and pressed against the anvil using clamping fingers 42 that are fixedly attached around an opening into which the wirebonding heads extend during wirebonding. The clamping fingers 42 are used to hold the leadframe 36 firmly in place against the anvil to prevent movement of the leadframe during wirebonding to ensure the bond placement is at the desired location.

Design rules for the maximum semiconductor die size that can be used for a given die attach pad size specify a particular amount of tolerance from the semiconductor die edge to the edge of the die attach pad, or to the edge of the swag area which is not included in the size of the die attach pad. The design rule tolerance is the sum of three tolerances. The first tolerance is from the clamping finger edge to the die attach pad edge. The second tolerance is a tolerance associated with the semiconductor die placement on the die attach pad. The third tolerance is an indexing tolerance between leadframes. Since the dimensions of the swag area are not included in the size of the die attach pad, the swag area dimensions set the maximum semiconductor die size that can be placed at the design rule tolerance on a die attach pad for a given leadframe size. By non-limiting example, a design rule tolerance is 0.6 mm and is composed of a clamping finger edge to the die attach pad edge of 0.3 mm, a semiconductor die placement tolerance of 0.2 mm, and an indexing tolerance of 0.1 mm. Thus, if the clamping finger edge to the die attach pad edge tolerance was eliminated by moving them into the swag area, this would gain 0.3 mm on two sides of the die attach pad, and a semiconductor die 0.6 mm larger in X or Y dimensions could then be placed on the die attach pad for the same leadframe size. Note that the ends/tips of the clamping finger 42 illustrated in FIG. 6 are not located in the swag area 44, but on the surface of the die attach pad 38 itself. This in part because the groove/flange/recess of the swag area 44 is not at the same level as the die attach pad 38 itself, which makes attempting to clamp the leadframe on the swag area 44 difficult to execute within the indexing tolerance and other processing variation.

Also, operating with the maximum die size for the given tolerance increases the odds that a misalignment on the anvil prior to pressing down of the clamping fingers can result in contact of a clamping finger with the semiconductor die, causing die cracking and yield loss. Thus a way to eliminate or substantially eliminate the clamping finger edge to the die attach pad edge tolerance using the swag area while still maintaining the ability to use the swag area as a mold lock would enable larger semiconductor die sizes and could reduce yield losses. Also because clamping fingers can be used in other semiconductor packaging process steps besides wirebonding, (sintering, reflow, etc.), the need to help reduce yield losses through die chipping and cracking resulting from multiple clamping operations.

Figure 7:
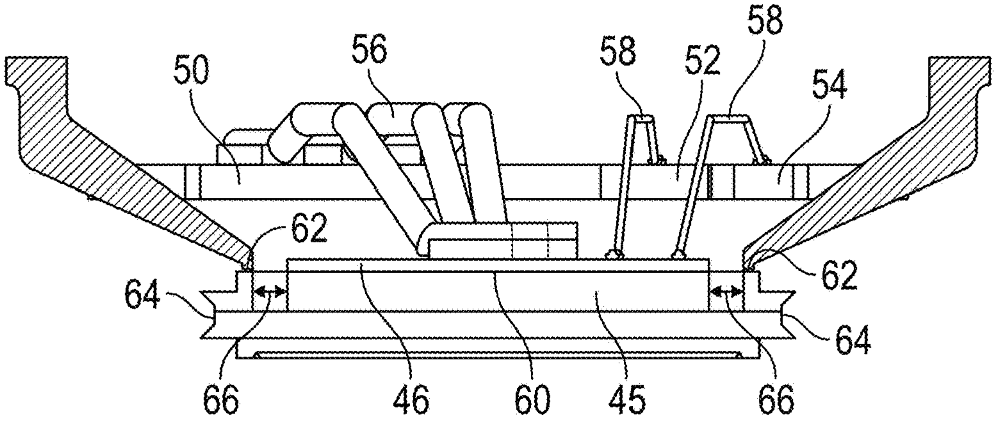
FIG. 7 is a cross sectional view of an implementation of a leadframe following wirebonding showing the location of clamping fingers thereon.

FIG. 7 is a cross sectional view of an implementation of a leadframe 45 following bonding of a semiconductor die 46 thereto and formation of wirebonds 48 thereon between upset leads 50, 52, 54 with bond wires 56, 58. As illustrated, die attach pad 60 has a largest planar surface that extends beneath the semiconductor die 46 upon which the tips of the clamping fingers 62 rest. The swag areas 64 extend on the other side from the tips of the clamping fingers 62 and the tolerances 66 are represented by the arrows in FIG. 7 on either side of the semiconductor die 46. By inspection, the size of the swag areas 64 brings the tips of the clamping finger 62 toward the semiconductor die 46, thus reducing the size of the semiconductor die that can be placed by the width of the two swag areas 64.

Figure 8:
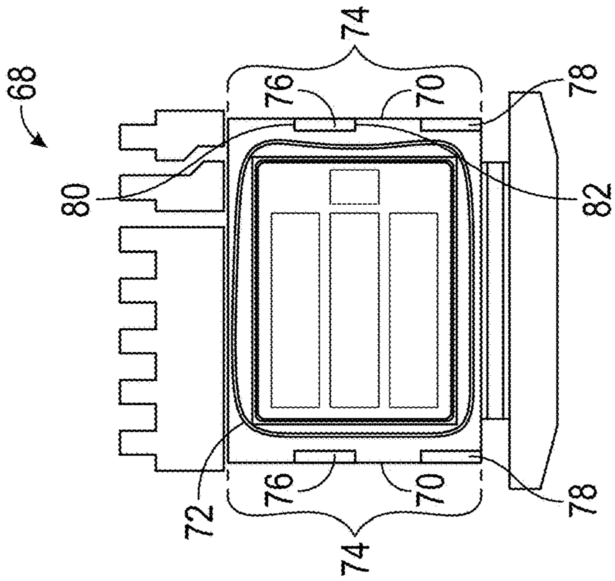
FIG. 8 is a top view of an implementation of a leadframe with a semiconductor die attached thereto.

Referring to FIG. 8, an implementation of a leadframe 68 is illustrated that includes swag areas 70 on opposing sides of die attach pad 72 that include an alternating pattern 74. As illustrated, the alternating pattern includes two downset features 76, 78 that are lower than the surface of the die attach pad 72 while the remainder of the larger planar surface of the swag areas 70 is at the same level as the surface of the die attach pad 72. In the leadframe 68 implementation of FIG. 8, the downset features 76, 78 have corners 80, 82 that form a sharp corner that is substantially a 90 degree angle. The downset features 76, 78 are formed using, by non-limiting example, a stamping process, a punching process, a milling process, or any other process that can remove/compress the material in the downset features below the level of the die attach pad 72. While two downset features 76, 78 are illustrated in FIG. 8, in other implementations of this leadframe design and in other implementations illustrated in this document, more than two downset features may be included.

Figure 9:
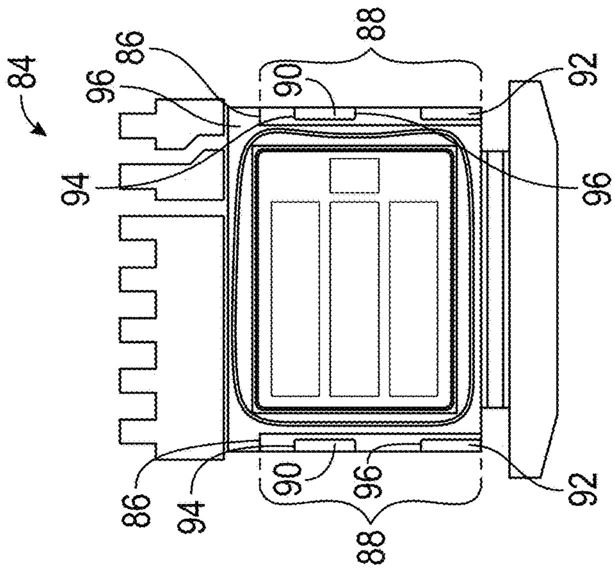
FIG. 9 is a top view of another implementation of a leadframe with a semiconductor die attached thereto.

Referring to FIG. 9, another implementation of a leadframe 84 is illustrated that includes swag areas 86 that include an alternating pattern 88 that includes two downset features 90, 92 which have corners 94, 96 that are rounded or have a rounded shape. These corners 94, 96 may be formed using any of the previously mentioned methods of forming the downset features in this document. The areas between the downset features 90, 92 are at the same level as the die attach area 96 of the leadframe 84 allowing the tips of the clamping fingers to rest on them in between the downset features 90, 92 as in the implementation illustrated in FIG. 8.

Figure 10:
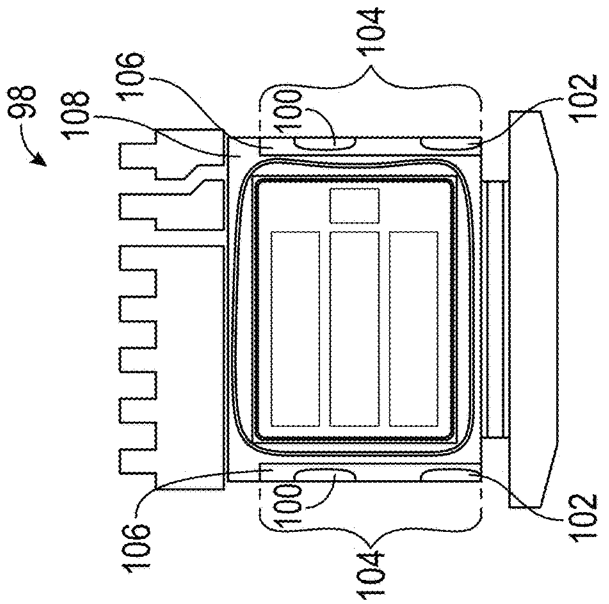
FIG. 10 is a top view of another implementation of a leadframe with a semiconductor die attached thereto.

The leadframe implementation 98 of FIG. 10 illustrates how the downset features 100, 102 of the alternating pattern 104 in the swag areas 106 may not have corners but instead be rounded, forming reentrant openings. These downset features 100, 102 can also be formed using any of the formation processes disclosed in this document. Since the swag areas 106 in this leadframe 98 are also at the same level as the die attach area 108 between the downset features 100, 102, the tips of the leadframe fingers can rest in the swag areas 106.

Figure 11:
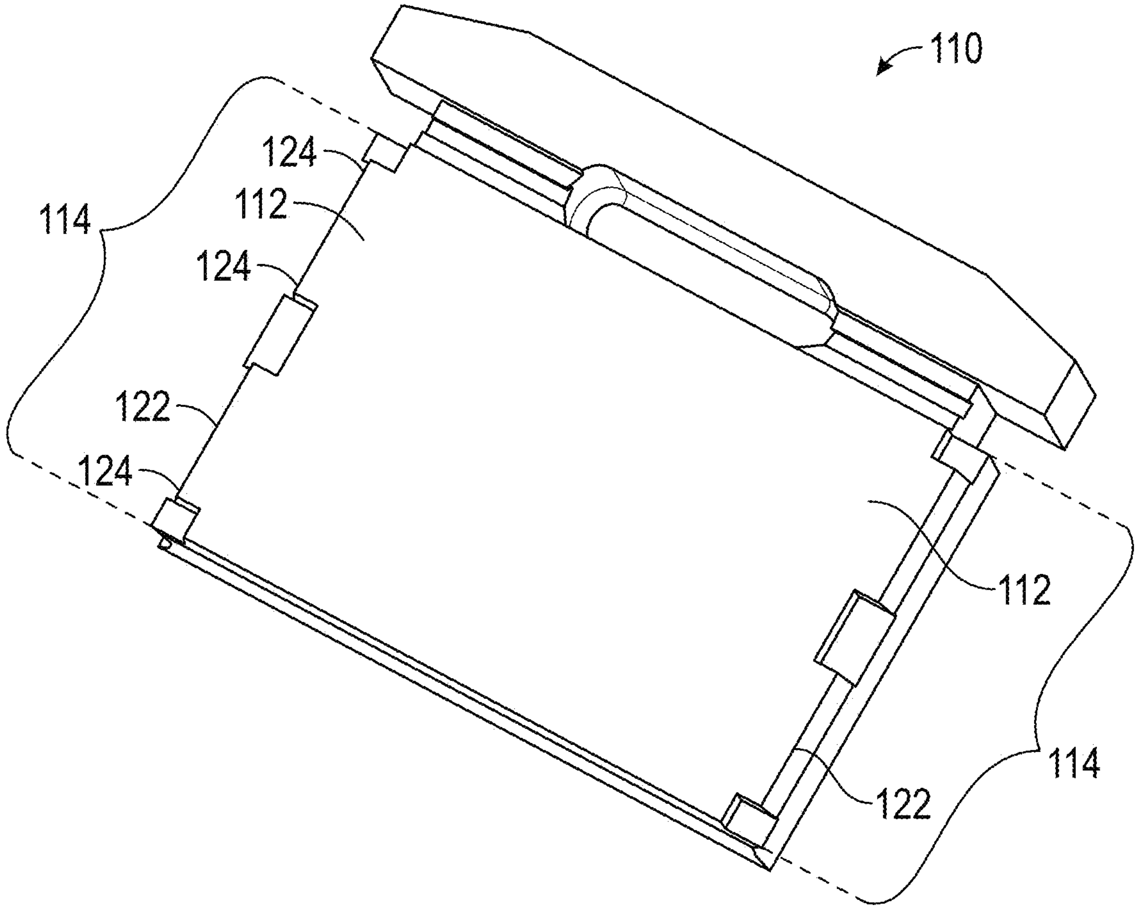
FIG. 11 is a perspective view of an implementation of a leadframe showing a swag area.

FIG. 11 illustrates a perspective view of a leadframe implementation 110 that includes swag areas 112 that include an alternating pattern 114 with downset regions 116, 118, 120 in a first largest planar surface 122 of the swag areas 112. In this implementation, the downset regions 116, 118, 120 extend beyond an edge 124 of the largest planar surface 122. This can occur due to the forming process for the downset regions 116, 118, 120, particularly where stamping or punching is used, which causes the material of the leadframe to travel outwardly. Also in this implementation, the downset regions are found only in the first largest planar surface 122 of the swag areas 112 and not on the other side.

Figure 12:
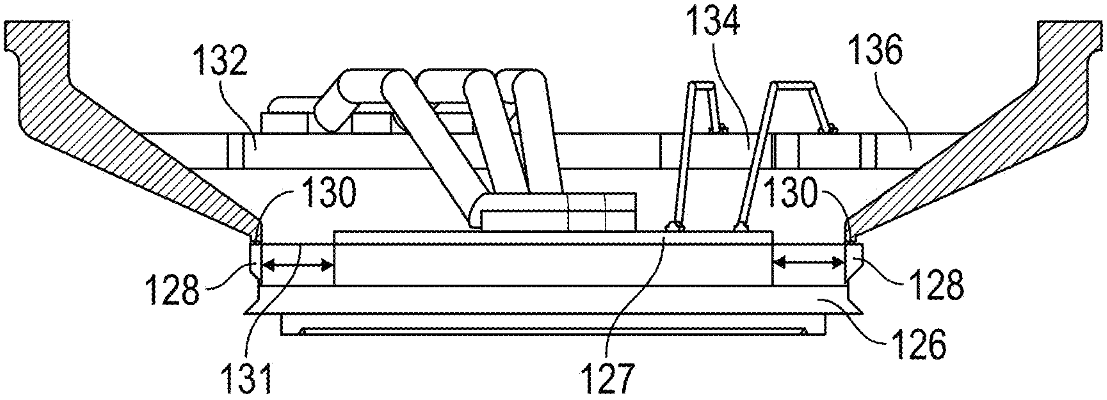
FIG. 12 is a cross sectional view of an implementation of a leadframe following wirebonding showing the location of clamping fingers thereon.

Referring to FIG. 12, a leadframe 126 is illustrated following bonding of a semiconductor die 127 to the die attach area 131 and wirebonding to leads 132, 134, 136. As illustrated, the leadframe 126 also includes a swag area 128 on each side and clamping finger tips 130 can be observed to be placed in the swag area 128. While not visible in this cross sectional view, the clamping finger tips 130 are placed in the alternating pattern in the swag area 128 between downset regions/features in the swag area. As indicated by the arrows, the maximum possible size of the semiconductor die 127 is now increased, because the arrows 130 represent a larger possible distance than the minimum design rule tolerance. This is because the areas between the downset features in the swag area 128 is now accessible to the clamping finger tips 130 as a reliable clamping location at the same level as the die attach area 131.

Figure 13:
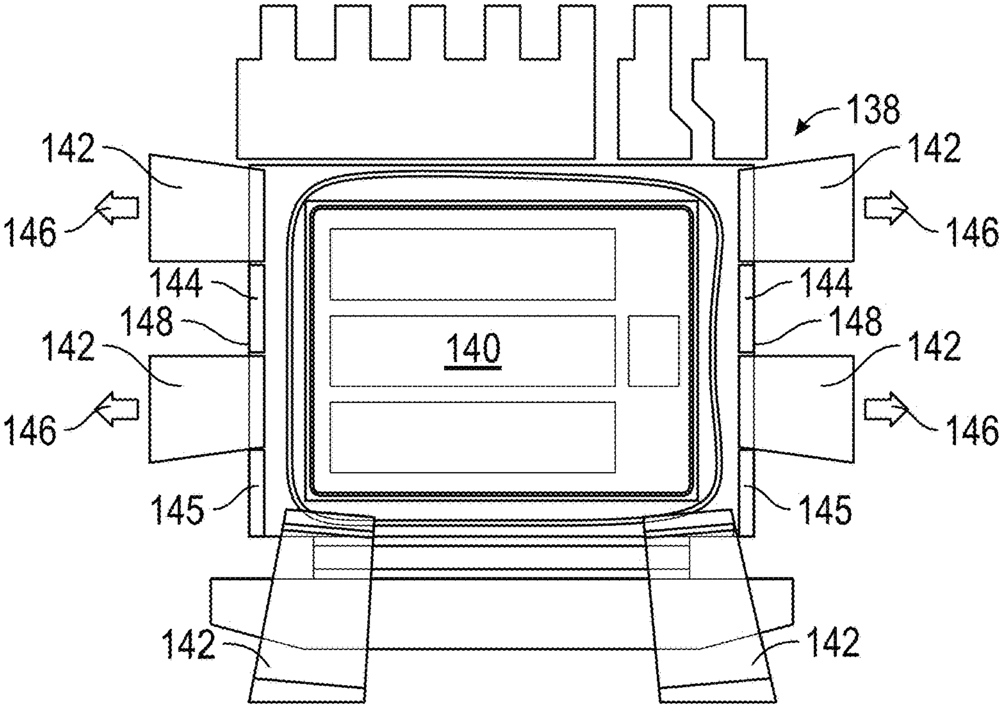
FIG. 13 is a diagram of an implementation of a leadframe with a semiconductor die thereon during a clamping operation.

FIG. 13 is a top view of a leadframe implementation 138 following bonding of a semiconductor die 140 thereon and placement of clamping fingers 142 into the areas between downset features 144, 145 of the swag area 148 on each side of the leadframe 138. The arrows 146 indicated how the clamping fingers 142 have been able to move outwardly away from the semiconductor die relative to the leadframe implementation of FIG. 6 because they can be placed in the swag area 148.

Figure 14:
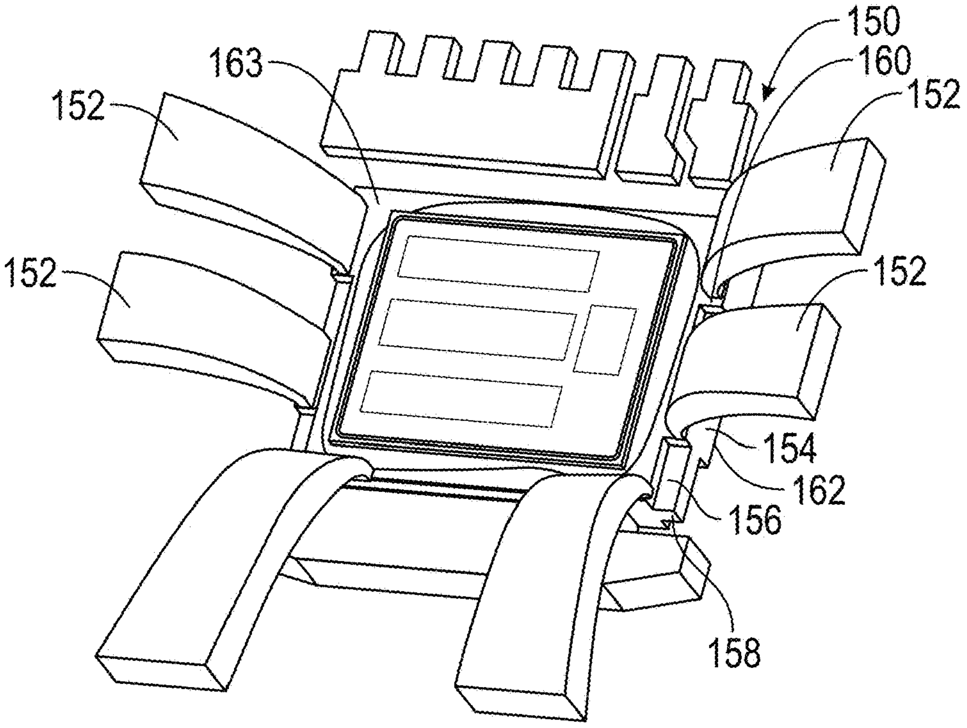
FIG. 14 is a perspective view of an implementation of a leadframe with a semiconductor die thereon showing the location of clamping fingers in a swag area.

Referring to FIG. 14, a perspective view of a leadframe implementation 150 is illustrated with clamping fingers 152 coupled thereto in the swag area 154. Here, the downset features 156, 158 are located in both a first largest planar surface 160 and in a second largest planar surface 162 of the swag area 154. This approach may help improve the mold locking capability of the swag area 154 after over molding is completed. The formation of the downset features 156, 158 may be carried out using any formation method disclosed in this document. In some implementations of a method of forming a leadframe for a semiconductor package, the material of the swag area 154 adjacent to the die attach pad 163 may be processed on the first largest planar surface 160 of the swag area 154 first, followed by processing on the second largest planar surface 162 of the swag area 154 (or vice versa, sequential processing). In other method implementations, however, both the first large planar surface 160 and second largest planar surface 162 may be processed simultaneously to form the downset features 156, 158.

Figure 15:
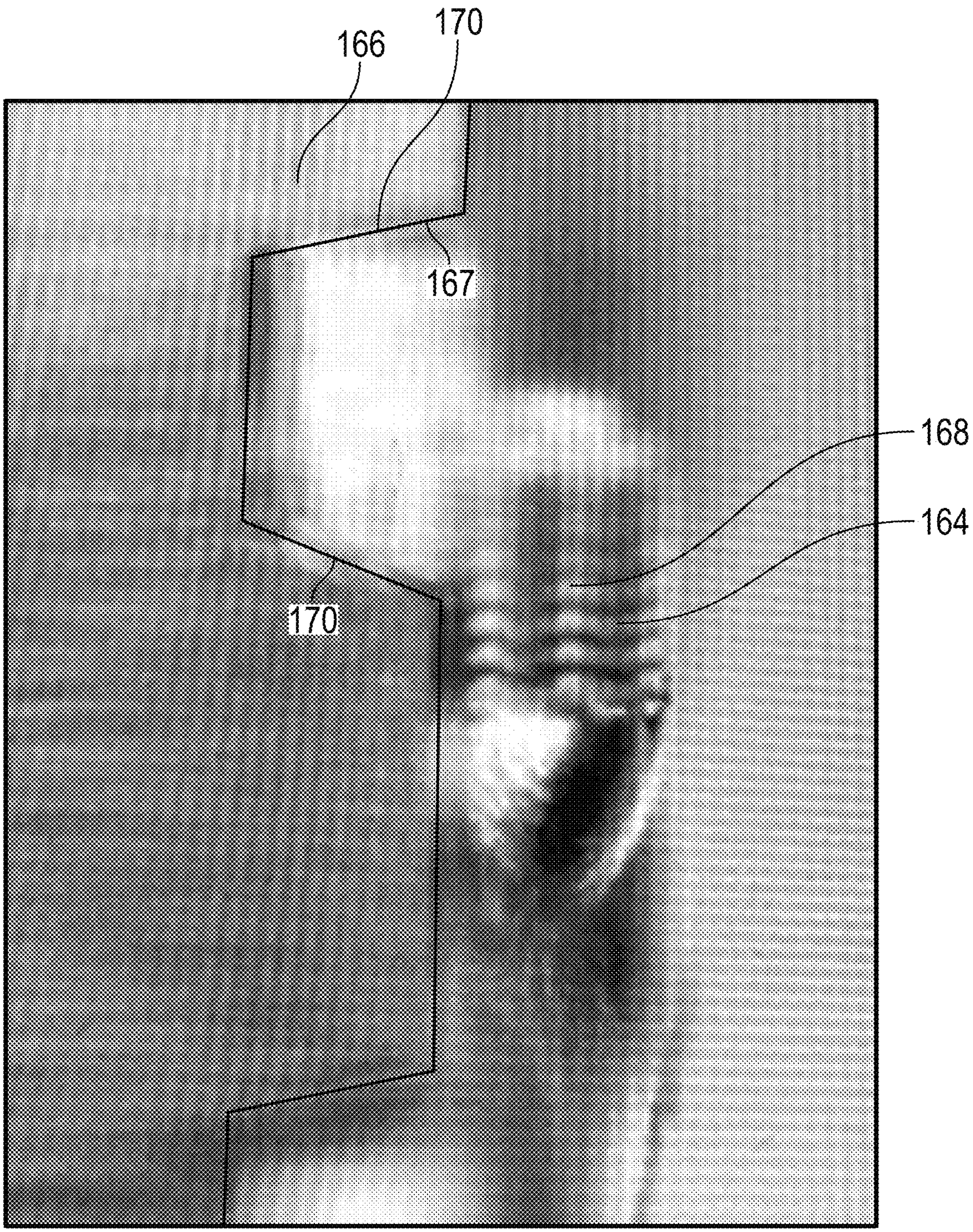
FIG. 15 is a photomicrograph of an implementation of a downset portion of an alternating pattern in a swag area showing an implementation of a mold lock pattern thereon.

Referring to FIG. 15, a photomicrograph of a downset feature 164 is illustrated in a perspective view after formation in swag area 166 to form a zigzag or alternating pattern 167. As visible in the photomicrograph, a dimpled pattern 168 is present in the surface of the downset feature 164 which includes angled edges 170 on each side. The dimpled pattern 168 may be included to further assist with mold locking as the material of the mold compound then can fill the areas between the dimples and improve the mechanical bond between the swag area 166 and the mold compound. A wide variety of mold lock patterns could be devised and formed using the various method of forming downset features disclosed herein, such as, by non-limiting example, cuboidal patterns, rectangular prism patterns, triangular prism patterns, pyramidal patterns, conical patterns, lined patterns, trenched patterns, elliptical patterns, or any other three dimensional closed shape capable of being formed into the material of the leadframe.

In various implementations of downset features, the corners of the downset features may include a chamfered edge, a fileted edge, or a rounded edge. A wide variety of corner types, shapes, orientations, angles, and structures may be formed using the principles disclosed in this document. Also, while the use of a leadframe has been illustrated in the various implementations disclosed in this document, since other substrate types also include swag areas during wirebond and other processing using clamping fingers, downset features in a wide variety of semiconductor substrate types can be formed. Examples of semiconductor substrate types that could be formed include, by non-limiting example, ceramic substrates, non-organic substrates, direct bonded copper (DBC) substrates, active metal brazed (AMB) substrates, laminated substrates, and any other substate type in which downset regions could be formed using a method consistent with the material of the substrate. Also, while the alternating pattern in the various leadframe implementations disclosed herein has been illustrated to be symmetrical or substantially symmetrical about a line of symmetry that crosses the die attach area, in others, the alternating pattern may not be symmetrical about a line of symmetry. Also, different numbers of downset features may be present in each swag area on either side of the die attach area in various implementations.

In places where the description above refers to particular implementations of semiconductor leadframes and implementing components, sub-components, methods and sub-methods, it should be readily apparent that a number of modifications may be made without departing from the spirit thereof and that these implementations, implementing components, sub-components, methods and sub-methods may be applied to other semiconductor leadframes.

What is claimed is:

1. A leadframe for a semiconductor package, the leadframe comprising:

a die attach pad comprising a swag area; and one or more leads;

wherein the swag area comprises an alternating pattern therein comprising at least two raised features and two downset features, the at least two raised features comprising a surface coplanar with a surface of the die attach pad, the surface of each of the at least two raised features configured to contact a clamping finger during a wirebonding process.

2. The leadframe of claim 1, wherein the swag area extends along two opposing sides of the die attach pad.

3. The leadframe of claim 1, wherein the alternating pattern is located in a first largest planar surface of the swag area and located in a second largest planar surface of the swag area opposing the first largest planar surface.

4. The leadframe of claim 1, wherein the at least two downset features comprise corners, the corners comprising a substantially 90 degree angle.

5. The leadframe of claim 1, wherein the at least two downset features comprise corners, the corners comprising a rounded shape.

6. The leadframe of claim 1, wherein the at least two downset features comprise corners, the corners comprising a chamfered edge, a fileted edge, or a rounded edge.

7. The leadframe of claim 1, wherein the at least two downset features comprising a mold lock pattern formed therein.

8. The leadframe of claim 7, wherein the mold lock pattern is a dimpled pattern.

9. A leadframe for a semiconductor package, the leadframe comprising:

a die attach pad comprising a swag area; and one or more leads;

wherein the swag area comprises an alternating pattern of indentations therein; and wherein the die attach pad is configured to receive a die thereon between the swag area extending along two opposing sides of the die attach pad.

10. The leadframe of claim 9, wherein two or more raised features of the alternating pattern of indentations are configured to engage with a clamping finger during a wirebonding process.

11. The leadframe of claim 9, wherein the swag area extends along two opposing sides of the die attach pad and wherein the alternating pattern of indentations is located in a first largest planar surface of the swag area and located in a second largest planar surface of the swag area opposing the first largest planar surface.

12. The leadframe of claim 9, wherein the indentations of the alternating pattern of indentations comprise at least two downset features.

13. The leadframe of claim 12, wherein the at least two downset features comprise corners, the corners comprising a substantially 90 degree angle.

14. The leadframe of claim 12, wherein the at least two downset features comprise corners, the corners comprising a rounded shape.

15. The leadframe of claim 12, wherein the at least two downset features comprise corners, the corners comprising a chamfered edge, a fileted edge, or a rounded edge.

16. The leadframe of claim 12, wherein the at least two downset features comprise a mold lock pattern formed therein.

17. A leadframe for a semiconductor package, the leadframe comprising:

a die attach pad comprising a swag area; and one or more leads;

wherein the swag area comprises a pattern comprising alternating raised features and downset features;

wherein the downset features comprise a mold lock.

18. The leadframe of claim 17, wherein the raised features comprise a surface coplanar with a surface of the die attach pad.

* * * * *